United States Patent
Pore et al.

(10) Patent No.: US 8,372,483 B2
(45) Date of Patent: Feb. 12, 2013

(54) METHODS FOR FORMING THIN FILMS COMPRISING TELLURIUM

(75) Inventors: Viljami Pore, Helsinki (FI); Timo Hatanpää, Espoo (FI); Mikko Ritala, Espoo (FI); Markku Leskelä, Espoo (FI)

(73) Assignee: ASM International N.V. (NL)

( * ) Notice: Subject to any disclaimer, the term of this patent is extended or adjusted under 35 U.S.C. 154(b) by 958 days.

(21) Appl. No.: 12/163,757

(22) Filed: Jun. 27, 2008

(65) Prior Publication Data

US 2009/0324821 A1   Dec. 31, 2009

(51) Int. Cl.
   *C23C 16/06* (2006.01)
(52) U.S. Cl. .................................................. 427/255.31
(58) Field of Classification Search ........... 427/255.29–255.33, 255.39; 117/89
   See application file for complete search history.

(56) References Cited

U.S. PATENT DOCUMENTS

| | | | |
|---|---|---|---|
| 2004/0233748 A1* | 11/2004 | Terao et al. | 365/202 |
| 2006/0035462 A1* | 2/2006 | Millward | 438/681 |
| 2006/0172067 A1* | 8/2006 | Ovshinsky et al. | 427/248.1 |
| 2006/0172083 A1* | 8/2006 | Lee et al. | 427/535 |
| 2007/0048977 A1* | 3/2007 | Lee et al. | 438/483 |
| 2007/0160760 A1* | 7/2007 | Shin et al. | 427/255.35 |
| 2008/0156651 A1* | 7/2008 | Kang et al. | 205/159 |
| 2009/0124039 A1* | 5/2009 | Roeder et al. | 438/99 |

OTHER PUBLICATIONS

"A Study of ZnTe Films Grown on Glass Substrates Using an Atomic Layer Evaporation Method," M. Ahonen et al., *Thin Solid Films*, 65 (1980) 301-307.

"Combined Atomic Layer and Chemical Vapor Deposition, and Selective Growth of $Ge_2Sb_2Te_5$ Films on TiN/W Contact Plug," Byung Joon Choi et al., *American Chemical Society, Chem. Mater.* 2007, 19, 4387-4389.

"GeSbTe deposition for the PRAM application", Junghyun Lee et al., *Applied Surface Science*, 253, (2007) 3969-3976.

* cited by examiner

*Primary Examiner* — Matthew Daniels
*Assistant Examiner* — Erin Snelting
(74) *Attorney, Agent, or Firm* — Knobbe, Martens, Olson & Bear, LLP

(57) ABSTRACT

Methods for controllably forming Sb—Te, Ge—Te, and Ge—Sb—Te thin films are provided. ALD processes can be used to deposit a first film comprising ZnTe. Providing an antimony source chemical, such as $SbI_3$, replaces the zinc, thereby forming $Sb_2Te_3$ thin films. Ge—Te and Ge—Sb—Te films can also be made by providing Ge sources to ZnTe and Sb—Te thin films, respectively.

27 Claims, 4 Drawing Sheets

METHODS FOR FORMING THIN FILMS COMPRISING TELLURIUM

PARTIES OF JOINT RESEARCH AGREEMENT

The invention claimed herein was made by, or on behalf of, and/or in connection with joint research agreement between the University of Helsinki and ASM Microchemistry signed on Nov. 14, 2003. The agreement was in effect on and before the date the claimed invention was made, and the claimed invention was made as a result of activities undertaken within the scope of the agreement.

BACKGROUND OF THE INVENTION

1. Field of the Invention

This invention relates generally to methods for forming thin films comprising tellurium (Te) on a substrate surface. Such films may be, for example, antimony-telluride (Sb—Te), germanium-telluride (Ge—Te), or germanium-antimony-telluride (Ge—Sb—Te) thin films.

2. Description of the Related Art

Te thin films such as Sb—Te, Ge—Te, and Ge—Sb—Te thin films are used in many different applications, including phase-change non-volatile electronic memories and optical storage materials. While many different phase change memory (PCM) cells are known, the operation of PCM cells comprising Te alloys is based on the resistivity difference between amorphous and crystalline states of the material. A resistivity difference of more than three orders of magnitude can be obtained by many different phase change alloys. The switching in a PCM cell is generally accomplished by heating the material locally with suitable current pulses, which, depending on the intensity of the pulse, leave the material in a crystalline or amorphous state. A wide variety of different PCM cell structures exist, many of which use trench or pore-like structures formed by sputtering.

Finding suitable Te precursors compatible with ALD processes has been challenging as many precursors do not result in film growth and/or are extremely toxic. Te hydride reactants, such as $H_2Te$, are typically highly toxic gases, which can be difficult to use. Te alkyl derivatives, such as $R_2Te$, are less toxic and less volatile; however, they are typically not as reactive as the Te hydrides.

A need exists for methods for controllably and reliably forming thin films comprising Te, particularly antimony-telluride, germanium-telluride, and germanium-antimony-telluride thin films.

SUMMARY OF THE INVENTION

In accordance with some embodiments of the present invention, methods for forming antimony-telluride films are provided. The methods comprise depositing a first film comprising Te on a substrate and exposing the first film to an antimony source, thereby forming a thin film comprising antimony-telluride.

In some embodiments, methods for forming a Sb—Te film in a phase change memory device are provided. The methods comprise depositing a zinc-telluride film and exposing the zinc-telluride film to an antimony source chemical. In some embodiments an atomic layer deposition (ALD) process is used to deposit ZnTe. The antimony source chemical may be provided in sequential pulses.

In accordance with other embodiments of the present invention, methods for forming germanium-telluride thin films are provided. The methods comprise depositing a first film comprising telluride on a substrate and exposing the first film to a germanium source, thereby forming a thin film of germanium and Te.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF SOME EMBODIMENTS

Figure 1:
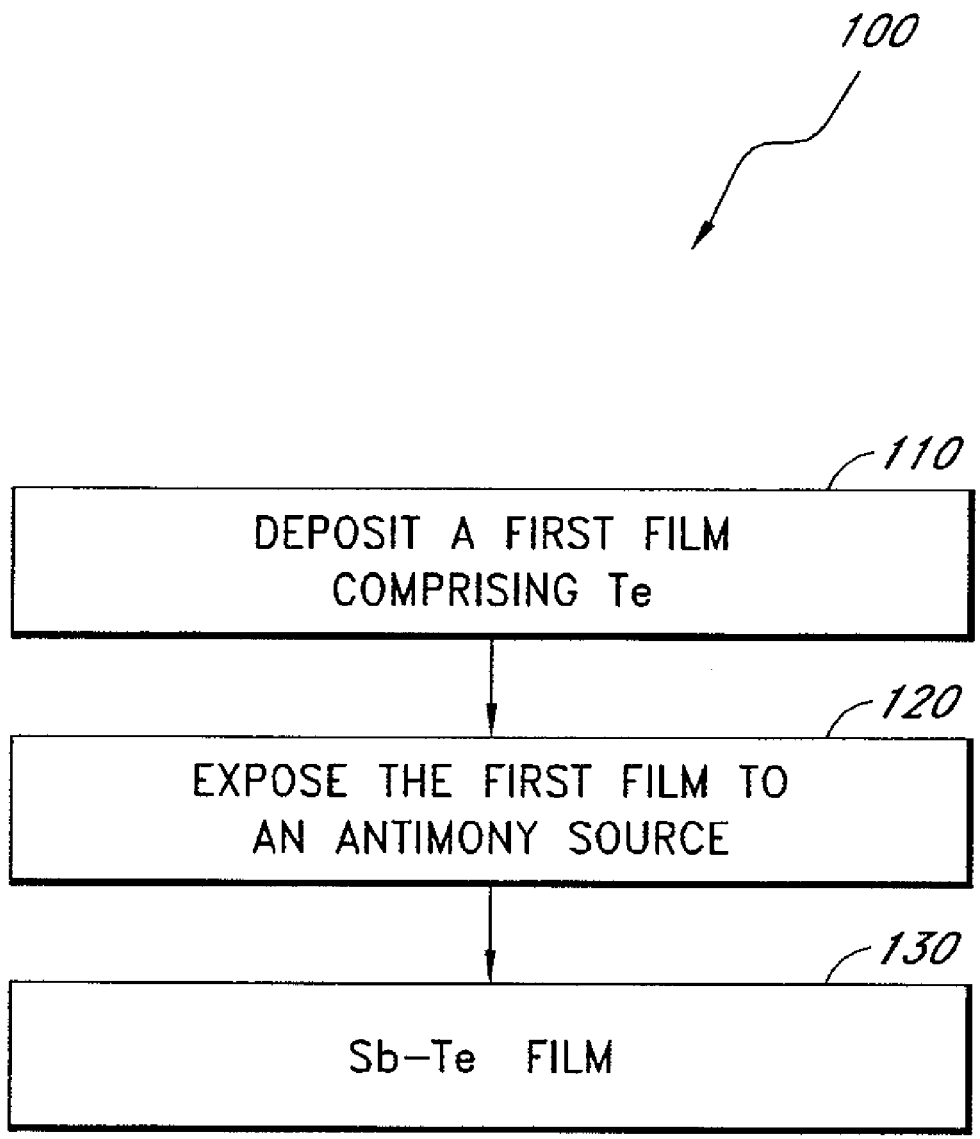
FIG. 1 is a flow chart generally illustrating a method for forming a Sb—Te film in accordance with one embodiment.

As discussed above, films comprising Te find use in a variety of applications, including phase change memory (PCM). While the embodiments of the present invention are discussed in the general context of PCM, the skilled artisan will appreciate that the principles and advantages taught herein will have application to other devices and applications. Furthermore, while a series of process steps are disclosed herein, one of ordinary skill in the art will recognize the utility of certain of the disclosed steps even in the absence of some of the other disclosed steps, and similarly that subsequent and intervening prior steps can be added.

Sb—Te, Ge—Te, and Ge—Sb—Te are among the suitable active materials that can be used in non-volatile PCM. Methods for forming Sb—Te, Ge—Te, and Ge—Sb—Te thin films using a reaction space suitable for performing ALD processes offer significant advantages over processes using sputtering. Using an ALD process provides greater precision and control over the deposition of materials. Sputtering may be capable of forming simple pore and trench structures, however, future PCM applications will require more complicated 3-D cell structures that cannot be formed using sputtering techniques. Processes with greater precision and control, such as ALD, will be required to make these complicated structures.

ALD is preferable in the context of PCM, and other applications requiring precise control, because it can do more complicated 3-D shapes with good conformality. However, other methods can be used in applications where precise control is not required.

Tellurium has several oxidation states, including −2, 0, +2, +4, and +6. Antimony has several oxidation states, including −3, +3, 0 and +5, of which +3 is most common. A stoichiometric Sb—Te film with Te in a −2 oxidation state comprises Sb$_2$Te$_3$. Germanium (Ge) has oxidation states of 0, +2, and +4.

Tellurium (Te) compounds, where Te has an oxidation state of −2, are generally called tellurides. Tellurium compounds, where Te has an oxidation state of 0, are generally called tellurium compounds. However, for the sake of simplicity, as used herein thin films comprising Te are referred to as tellurides. Thus films referred to as tellurides herein may contain Te with oxidations states other than −2, for example, oxidation states of 0, +2, +4, and +6. It will be apparent to the skilled artisan when a particular oxidation state is intended.

As used herein, atomic layer deposition (ALD) refers to any vapor deposition process that is based on controlled, self-limiting reaction of precursor chemicals. In an ALD process, gas phase reactions are avoided by contacting a substrate alternately and sequentially with vapor phase reactants. Vapor phase reactants may be separated from each other in the reaction chamber, for example, by removing excess reactants and/or reactant by-products from the reaction chamber between reactant pulses. This purge step may be accomplished with an evacuation step and/or with the aid of an inactive gas pulse. In some embodiments an inactive carrier gas is used to feed the reactants into the reaction chamber and also serves as a purge gas to push excess reactants and/or reaction byproducts out of the reaction chamber.

An ALD cycle preferably comprises alternating and sequential provision (or pulses) of a first and second reactant. Depending on the nature of the film to be formed, additional reactants may be included. The first reactant is conducted into the chamber in the form of vapor phase pulse, optionally with the aid of a carrier gas, and contacted with the surface of the substrate. Conditions are selected such that no more than about one monolayer of the precursor is adsorbed on the substrate surface in a self-limiting manner per cycle. Excess first reactant and reaction byproducts, if any, are purged from the reaction chamber, often with a pulse of inert gas such as nitrogen or argon. In some embodiments this is accomplished by turning off the flow of reactant to an inert carrier gas, while continuing to flow the carrier gas through the chamber.

In the next phase of the ALD cycle, a second gaseous reactant is pulsed into the chamber where it reacts with the first reactant bound to the surface. Again, reactants and conditions are selected such that this step is also self-limiting. Excess second reactant and gaseous by-products of the surface reaction are removed from the reaction chamber, also preferably with the aid of an inert gas.

The steps of pulsing and purging (the ALD cycle) are repeated until a thin film of the desired thickness and composition has been formed on the substrate, with each cycle leaving no more than a molecular monolayer.

Although the above process describes first and second reaction cycles, the cycles may begin and end with any reactant depending on the particular circumstances.

As mentioned above, each pulse or phase of each ALD cycle is preferably self-limiting. An excess of reactant precursors is supplied in each phase to saturate the susceptible substrate surfaces. Surface saturation ensures reactant occupation of all available reactive sites (subject, for example, to physical size or "steric hindrance" restraints) and thus excellent step coverage. The methods disclosed herein can also be performed in ALD process chambers.

Generally, the deposition temperatures for all kinds of Te precursors range from about 50° C. to about 450° C. In some embodiments the deposition temperature can be higher than 450° C., such as in a high-temperature reactor. In some embodiments Te precursors with sufficient vapor pressure for low temperature deposition are used and the deposition temperature can be lower than 450° C., preferably between about 50° C. and 400° C. and more preferably between about 100° C. and about 350° C.

FIG. 1 is a flow chart of a method for forming a Sb—Te thin film in accordance with one embodiment. The first step of the method 100 is to deposit a first film comprising Te 110. The film comprising Te can comprise other elements, including metals. Preferably, the first film comprises Te and zinc. More preferably the first film is ZnTe.

Although deposition of the first film by ALD is described in detail herein, the first film can be deposited by any suitable method such as, physical vapor deposition (PVD), chemical vapor deposition (CVD), etc. In some embodiments the first film is deposited by PVD or CVD. In other embodiments, the first film is deposited via a self limiting process like ALD. An appropriate deposition method can be selected by the skilled artisan based on the particular circumstances.

In some embodiments, the ZnTe film is deposited by ALD, with cycles of alternately and sequentially exposing the substrate to zinc and Te source chemicals. Typically, between about 5 and about 10000 ALD cycles are used to form the first film, each having a duration of about 1 seconds to about 60 seconds. Organic and inorganic volatile zinc and Te source chemicals can be used. Preferably, the source chemicals are elemental zinc and elemental Te.

In some embodiments, the Te precursor has a formula of Te(SiR$^1$R$^2$R$^3$)$_2$, wherein R$^1$, R$^2$, and R$^3$ are alkyl groups comprising one or more carbon atoms. The R$^1$, R$^2$, and R$^3$ alkyl groups can be selected based on the desired physical properties of the precursor such as volatility, vapor pressure, toxicity, etc. In some embodiments the Te precursor is Te(SiMe$_2$Bu)$_2$. In some embodiments the precursor is Te(SiEt$_3$)$_2$.

The first film is typically deposited at substrate temperatures between about 375° C. and about 450° C. Preferably, the first film is deposited at substrate temperatures between about 430° C. and about 450° C. In some embodiments when a Te precursor having a formula of Te(SiR$^1$R$^2$R$^3$)$_2$ is used as the Te precursor, the deposition temperature can be lower, preferably between about 50° C. and about 400° C. and more preferably between about 100° C. and about 300° C.

The thickness of the first ZnTe film can be selected based on the desired thickness of the resulting Sb—Te film in a particular application, such as PCM. Typically, Sb—Te films in PCM applications are between about 1 nm and about 200 nm. Preferably, the first film has a thickness between about 5 nm and about 100 nm. Other applications may require thicknesses between about 1 nm and about 1000 nm.

In some embodiments, thicker films can be formed by depositing a ZnTe film, converting it to Sb—Te, and then depositing a second ZnTe film and converting it to Sb—Te. The steps can be repeated until a film of the desired thickness is formed. Preferably, multiple cycles are used for forming Sb—Te films thicker than about 50 nm. As described in the examples, ZnTe thin films have been efficiently converted to Sb—Te for thicknesses of at least 60 nm.

After the film comprising Te has been deposited 110, the first film is exposed to an antimony source 120. The antimony source or precursor can comprise Sb(N(CH$_3$)$_2$)$_3$, Sb(i-C$_3$H$_7$)$_3$, or other organic and inorganic compounds containing antimony. Preferably the antimony source has a formula SbX$_3$ wherein X is a halogen element. More preferably the antimony source is an Sb halide compound, such as SbI$_3$, SbBr$_3$ or SbCl$_3$.

In some embodiments the antimony source can be provided in sequential pulses. In one embodiment the antimony source can be provided sequentially with purging steps between sequential pulses. The pulsing and purging steps can have a length from about 0.1 seconds to 100 seconds. In other embodiments, the antimony source chemical can be provided in excess. In some embodiments, the substrate temperature is between about 375° C. and about 450° C. during exposing the first film to an antimony source.

Preferably, providing the antimony source results in a conversion rate of the ZnTe thin film of about 0.5 Å/second or higher. For example, converting a 50 nm thick ZnTe thin film to Sb—Te in 1000 seconds results in a conversion rate of 0.5 Å/second. Even more preferably the conversion rate of zinc is more than about 1.0 Å/second.

In other embodiments exposing the first film to an antimony source can comprise alternately and sequentially exposing the substrate to pulses of an antimony source, such as $SbI_3$ and elemental Te in an ALD type process.

The antimony source exposure 120 results in formation of a Sb—Te film 130. In some embodiments the Sb—Te thin film has a formula of $Sb_2Te_x$ film. Generally, the x value is between about 0.5 and about 3.5, and preferably between about 1 and about 3.5.

As discussed in reference to FIG. 3 below, the antimony source exposure comprises a replacement reaction, removing substantially all of the zinc or other compound in the Te thin film, thereby forming a $Sb_2Te_x$ thin film. Preferably the Zn concentration in the Sb—Te thin film is less than about 1 atomic-%.

Figure 2:
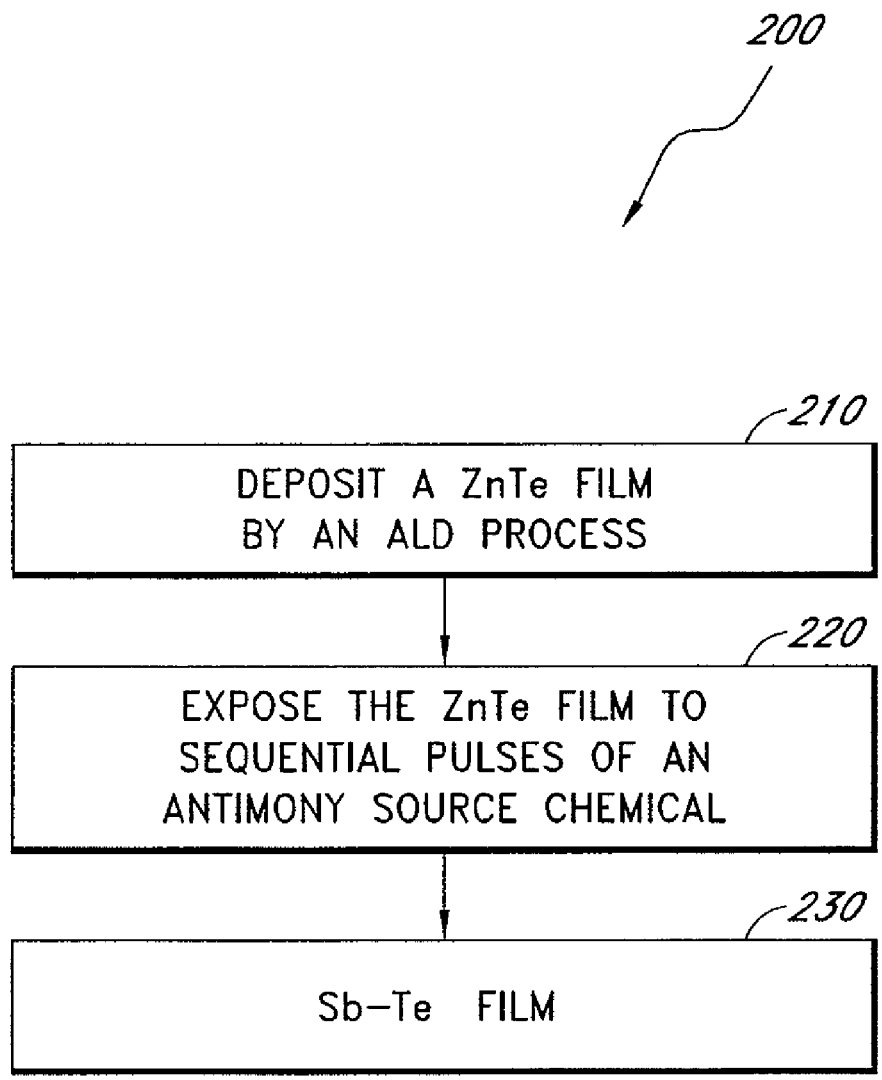
FIG. 2 is a flow chart generally illustrating a method for forming a Sb—Te film in accordance with one embodiment.

FIG. 2 is a flow chart of a process for forming a Sb—Te thin film in accordance with another embodiment. The first step of the method 200 is to deposit a zinc-telluride film by an ALD process 210. Preferably, the zinc-telluride film is ZnTe.

The ALD process can comprise multiple cycles of alternately and sequentially exposing the substrate to pulses of zinc and Te precursors. Preferably, the precursors are elemental zinc and elemental Te. Each pulse of a precursor can have a length from about 0.1 seconds to about 60 seconds. Depending on the precursor, each cycle generally deposits a film about 0.1 Å to about 3 Å thick. Typically, the number of cycles used to form the zinc-telluride film is between about 5 and about 10,000 but will depend upon the thickness of the film to be deposited.

In some embodiments the zinc-telluride film has a thickness between about 5 nm and 100 nm. The substrate temperature during deposition of the zinc-telluride film is typically between about 50° C. and about 450° C. Preferably, the zinc-telluride film is deposited at substrate temperatures between about 100° C. and about 450° C.

Next, the ZnTe film is exposed to sequential pulses of an antimony source chemical 220. In some embodiments, excess source chemicals can be purged from the reactor between sequential pulses of the antimony source chemical. However, the purge is not necessary between antimony source chemical pulses. The antimony source chemical or precursor can comprise, for example, an Sb-alkyl compound, $Sb(N(CH_3)_2)_3$, $Sb(i-C_3H_7)_3$, $SbCl_3$, $SbBr_3$, $SbI_3$, or other organic and inorganic compounds containing antimony. More preferably, the antimony source chemical is $SbI_3$. As discussed in greater detail below, the antimony source chemical replaces zinc, thereby forming a $Sb_2Te_x$ thin film 230.

In some embodiments thin films comprising one or more of CdTe, PbTe, $In_2Te_3$ and $Bi_2Te_3$ are first deposited by ALD or CVD and subsequently converted to Sb—Te by exposing the thin film to an antimony source chemical. The antimony source chemical exposure conditions can be used as described above.

In some embodiments, the $Sb_2Te_x$ thin film can be further exposed to a germanium source. The germanium source exposure can result in formation of a Ge—Sb—Te thin film. Preferably, the Ge—Sb—Te film is $Ge_2Sb_2Te_5$. The germanium source can comprise organic or inorganic germanium compounds. Preferably, the germanium source comprises one or more of $GeF_4$, $GeCl_4$, $GeBr_2$, $GeBr_4$, $GeI_4$, an organometallic Ge compound or an alkylamide Ge compound. More preferably, the germanium source is $GeBr_2$. In some embodiments, the germanium source and process conditions are selected such that the germanium source exposure is self limiting, resulting in a Ge—Sb—Te thin film comprising $Ge_2Sb_2Te_5$. The germanium source exposure can comprise sequential pulses of the germanium source. In some embodiments, excess reactants can be purged from the reaction chamber between sequential pulses.

In another embodiment, a Ge—Te film is formed by replacing a metal in a compound telluride film with Ge. A first film comprising Te is deposited on a substrate. The first film preferably comprises Te and another metal, such as zinc. More preferably, the first film is ZnTe. The first film can be deposited by known deposition methods, such as those described above in reference to other embodiments. The first film is preferably deposited using elemental zinc and elemental Te.

Next, the first film is exposed to a germanium source, thereby forming Ge—Te. The germanium source can comprise organic or inorganic germanium compounds. Preferably, the germanium source comprises $GeF_4$, $GeCl_4$, $GeBr_2$, $GeBr_4$, $GeI_4$, an organometallic Ge compound, or an alkylamide Ge compound. Preferably, the substrate temperature during exposing the first film to a germanium source is between about 400° C. and about 500° C. The germanium source is chosen such that it forms a Ge—Te film. In one embodiment the germanium source replaces substantially all of the zinc in a first film comprising ZnTe.

In another embodiment, a first film comprising Te is deposited on a substrate as described above in reference to other embodiments. Next, the first film is exposed to a germanium source and antimony source simultaneously. The simultaneous exposure may include providing the germanium source and antimony source at the same time. The simultaneous exposure may also include alternately and sequentially providing the germanium source and antimony source. The germanium source and antimony sources can comprise any of the sources described herein.

In some embodiments, any of the thin films described in the embodiments above can be doped with desired dopants for phase change memory applications. Preferred dopants include N, O, Si, S, In, Ag, Sn, Au, As, Bi, Zn, Se, Te, Ge, Sb and Mn. The thin films can be doped by adding pulses of the corresponding precursor to the deposition cycle. For example, a pulse of a compatible precursor comprising the desired dopant can be inserted into the deposition cycle. The dopant pulse can be inserted into the deposition cycle in a predetermined pattern depending on the desired dopant concentration. For example, the dopant pulse could be programmed to be provided after every third deposition cycle.

EXAMPLE 1

In one experiment a Sb—Te thin film was prepared. First, a ZnTe film was formed by ALD using elemental zinc and elemental Te precursors. The zinc and Te precursor temperatures were around 390° C. to 405° C. 1000 ALD cycles were used with pulse/purge times of about 1 second. The substrate temperature during deposition of the ZnTe film was around 430° C.

Next, the ZnTe film was exposed to 1000 sequential SbI$_3$ pulses with each pulse/purge step lasting about 1 second. The substrate temperature while pulsing SbI$_3$ was 415° C. The resulting Sb—Te film was approximately 60 nm thick.

Figure 3:
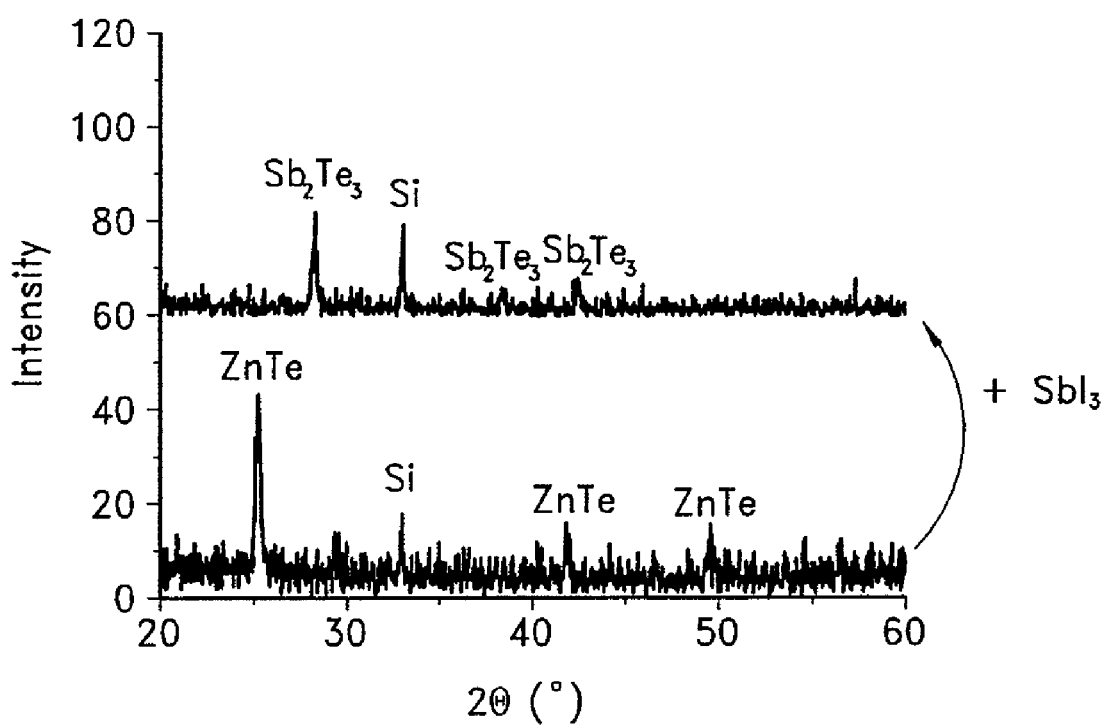
FIG. 3 is an X-ray diffractogram of a ZnTe film before and after $SbI_3$ exposure.

FIG. 3 shows an x-ray diffractogram of a ZnTe film before and after providing SbI$_3$ according to the process conditions of this example. The first plot, closer to the x-axis, represents the x-ray diffractogram for the ZnTe film formed in this example. Three of the four most prominent peaks on this plot represent ZnTe, with the other peak representing Si because the ZnTe film was formed on a silicon substrate.

With continued reference to FIG. 3, the second plot is further away from the x-axis and represents the film after exposure to SbI$_3$. The first and second plots both show a Si peak at similar 2θ values because the underlying substrate was a silicon substrate and did not react with SbI$_3$. The second plot does not show any peaks corresponding to the 2θ values of the ZnTe peaks on the first plot. Instead, the second plot shows three prominent peaks corresponding to a Sb$_2$Te$_3$ compound. This indicates that the Sb substitution for Zn in the thin film is very efficient. The replacement reaction replaced substantially all of the Zn with Sb. This was further verified by an energy dispersive x-ray (EDX) analysis of the illustrated film which did not show the presence of any Zn in the thin film after it was exposed to SbI$_3$. The EDX analysis indicated that the composition of the illustrated film after exposure to SbI$_3$ was Sb$_2$Te$_{3.4}$.

Figure 4:
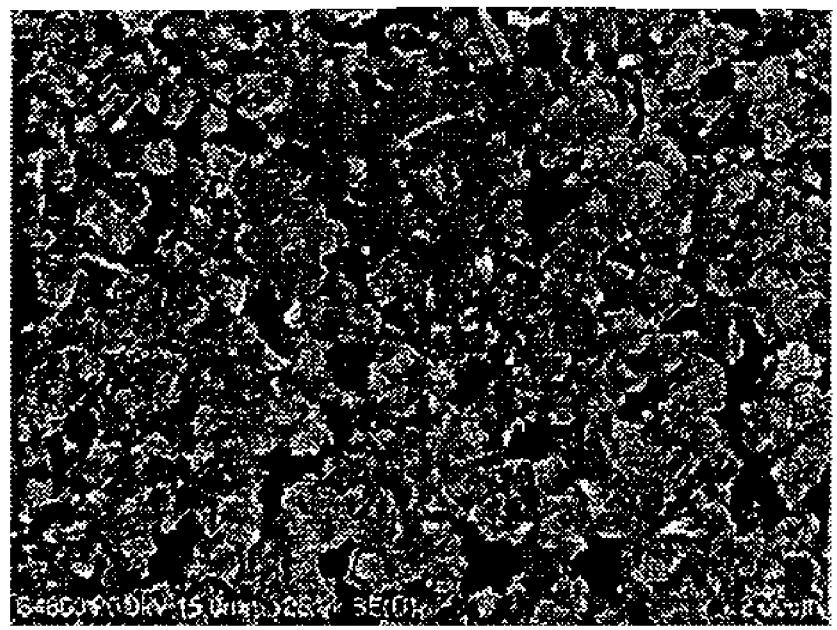
FIG. 4 is a field emission scanning electron microscope (FESEM) image of an antimony-telluride film.

FIG. 4 is a field emission scanning electron microscope (FESEM) image of an antimony-telluride film produced in this example. Thinner films may have a different morphology than that illustrated in FIG. 4.

EXAMPLE 2

In another experiment a Sb—Te thin film was prepared. The ZnTe film was formed under conditions similar to those of Example 1.

After formation of the ZnTe film, the film was exposed to multiple cycles of alternating and sequential pulses of SbI$_3$ and Te. About 1000 cycles were used, with each pulse/purge step lasting about 1 second. The substrate temperature while providing SbI$_3$ and Te was 415° C. The resulting Sb—Te film was approximately 60 nm thick. EDX analysis indicated that no zinc remained in the film and that the film composition was Sb$_2$Te$_{3.1}$.

The methods disclosed herein provide many advantages over those known in the art. Embodiments of the methods disclose reliable and controllable methods for making Sb—Te, Ge—Te, and Ge—Sb—Te thin films. The Sb—Te, Ge—Te, and Ge—Sb—Te thin films can be made without the use of hydrogen plasma and toxic Te precursors.

It will be appreciated by those skilled in the art that various modifications and changes can be made without departing from the scope of the invention. Similar other modifications and changes are intended to fall within the scope of the invention, as defined by the appended claims.

We claim:

1. A method for forming an antimony telluride film on a substrate comprising:
    depositing a first film comprising Te and another metal on a substrate; and
    exposing the first film to an antimony source chemical, thereby forming a thin film of Sb$_2$Te$_x$ with a composition that is different from the first film.

2. The method of claim 1, wherein the first film comprises ZnTe.

3. The method of claim 2, wherein exposing the first film to an antimony source replaces substantially all of the zinc with antimony.

4. The method of claim 2, wherein depositing a first film comprises multiple cycles of an atomic layer deposition process (ALD) comprising alternately and sequentially exposing the substrate to a Te source chemical and a zinc source chemical.

5. The method of claim 4, wherein the Te source chemical is elemental Te; and wherein the zinc source chemical is elemental Zn.

6. The method of claim 4, wherein the first film has a thickness between about 50 Å and about 100 nm.

7. The method of claim 2, wherein the ZnTe film is formed by physical vapor deposition (PVD) or chemical vapor deposition (CVD).

8. The method of claim 1, wherein the antimony source chemical comprises SbX$_3$, wherein X is a halogen element.

9. The method of claim 1, wherein the antimony source chemical comprises SbI$_3$.

10. The method of claim 1, wherein the antimony source chemical is supplied in excess.

11. The method of claim 1, wherein the antimony source chemical is supplied in sequential pulses.

12. The method of claim 1, wherein x is between about 0.5 and about 3.5.

13. The method of claim 1, wherein the temperature of the substrate during deposition of the first film is about 50° C. to about 450° C.

14. The method of claim 1, wherein the substrate temperature during exposing the first film to an antimony source is about 375° C. to about 450° C.

15. The method of claim 1, wherein exposing the first film comprises an ALD process comprising alternately and sequentially exposing the substrate to pulses of SbI$_3$ and elemental Te.

16. The method of claim 1, further comprising doping the film with one or more of N, O, Si, S, In, Ag, Sn, Au, As, Bi, Zn, Se, Te, Ge, Sb and Mn.

17. The method of claim 1, further comprising exposing the antimony-telluride thin film to a germanium source, thereby forming a germanium-antimony-telluride thin film.

18. The method of claim 17, wherein the germanium-antimony-telluride film is Ge$_2$Sb$_2$Te$_5$.

19. The method of claim 17, wherein exposing the antimony-telluride thin film to a germanium source is done by sequential pulses.

20. The method of claim 1, wherein depositing the first film comprises 5 or more cycles of an atomic layer deposition (ALD) process.

21. A method for forming a Sb-Te film in a phase change memory device comprising:
    depositing a zinc-telluride film by an ALD process; and
    exposing the zinc-telluride film to an antimony source chemical.

22. The method of claim 21, wherein the ALD process comprises multiple cycles of alternating and sequential pulses of elemental zinc and elemental Te precursors.

23. The method of claim 21, wherein the antimony source chemical is SbI$_3$.

24. The method of claim 21, wherein the zinc-telluride film has a thickness between about 5 nm and about 100 nm.

25. A method for forming a germanium telluride thin film comprising:

depositing a first film comprising Te and another element on a substrate; and exposing the first film to a germanium source, thereby forming a thin film comprising germanium and Te with a composition that is different from the first film, wherein the first film is deposited with elemental Te and elemental zinc.

26. The method of claim 25, wherein during exposing the substrate has a temperature between about 400° C. and about 500° C.

27. The method of claim 25, wherein depositing the first film comprises 5 or more cycles of an atomic layer deposition (ALD) process.

* * * * *